United States Patent
Yu et al.

(10) Patent No.: US 12,236,818 B2
(45) Date of Patent: Feb. 25, 2025

(54) DISPLAY DRIVE SYSTEM AND METHOD, AND DISPLAY DEVICE

(71) Applicants: BOE Intelligent IoT Technology Co., LTD., Beijing (CN); BOE Technology Group Co., Ltd., Beijing (CN)

(72) Inventors: Chao Yu, Beijing (CN); Enhui Guan, Beijing (CN); Zhongkui Wan, Beijing (CN); Xinyi Cheng, Beijing (CN); Changlin Leng, Beijing (CN); Xingqun Jiang, Beijing (CN); Youxiang Xia, Beijing (CN)

(73) Assignees: BOE Intelligent IoT Technology Co., LTD., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/026,091
(22) PCT Filed: Apr. 29, 2022
(86) PCT No.: PCT/CN2022/090189
§ 371 (c)(1),
(2) Date: Mar. 13, 2023
(87) PCT Pub. No.: WO2023/206333
PCT Pub. Date: Nov. 2, 2023

(65) Prior Publication Data
US 2024/0312379 A1 Sep. 19, 2024

(51) Int. Cl.
G09G 3/00 (2006.01)
G09G 3/32 (2016.01)
H01L 25/16 (2023.01)

(52) U.S. Cl.
CPC ............. G09G 3/006 (2013.01); G09G 3/32 (2013.01); G09G 2330/08 (2013.01); H01L 25/167 (2013.01)

(58) Field of Classification Search
CPC ...... G09G 3/006; G09G 3/23; G09G 2330/08; H01L 25/167
See application file for complete search history.

(56) References Cited

U.S. PATENT DOCUMENTS

| | | | |
|---|---|---|---|
| 2010/0176745 A1* | 7/2010 | Keh | H05B 45/3725 315/294 |
| 2017/0270845 A1* | 9/2017 | Kuo | G09G 3/32 |

(Continued)

FOREIGN PATENT DOCUMENTS

| | | |
|---|---|---|
| CN | 203325410 U | 12/2013 |
| CN | 106157862 A | 11/2016 |

(Continued)

*Primary Examiner* — Ryan A Lubit
(74) *Attorney, Agent, or Firm* — IPro, PLLC

(57) ABSTRACT

Provided is a display drive system, including: a plurality of drive units and a control unit. The plurality of drive units are connected to a lamp panel, and at least one of the plurality of drive units is configured to drive, during a display stage, the lamp panel to emit light. The control unit is connected to the plurality of drive units, and is configured to detect an operating state of the drive units driving the lamp panel to emit light. In response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit.

18 Claims, 5 Drawing Sheets

(56) References Cited

U.S. PATENT DOCUMENTS

2020/0052033 A1* 2/2020 Iguchi .................. H01L 27/156
2020/0302841 A1* 9/2020 Jung .................... G09G 3/3275
2022/0020310 A1* 1/2022 Gray ....................... G09G 3/32
2022/0215805 A1* 7/2022 Im ........................ G09G 3/3275

FOREIGN PATENT DOCUMENTS

| CN | 108010490 | A | 5/2018 |
| CN | 110349546 | A | 10/2019 |
| CN | 111627400 | B | 2/2021 |
| CN | 113474833 | A | 10/2021 |
| CN | 113948036 | A | 1/2022 |

* cited by examiner

DISPLAY DRIVE SYSTEM AND METHOD, AND DISPLAY DEVICE

CROSS-REFERENCE TO RELATED APPLICATION

The present disclosure is a U.S. national stage of international application No. PCT/CN2022/090189, filed on Apr. 29, 2022, the content of which is herein incorporated by reference in its entirety.

TECHNICAL FIELD

The present disclosure relates to the field of display technologies, and in particular, relates to a display drive system, a display drive method, and a display device.

BACKGROUND OF THE INVENTION

A display device includes a lamp panel and a display drive system.

SUMMARY OF THE INVENTION

Embodiments of the present disclosure provide a display drive system, a display drive method, and a display device. The technical solutions are as follows.

Some embodiments of the present disclosure provide a display drive system. The display drive system includes a plurality of drive units and a control unit; wherein the plurality of drive units are connected to a lamp panel, and at least one of the plurality of drive units is configured to drive, during a display stage, the lamp panel to emit light; and the control unit is connected to the plurality of drive units, and is configured to detect an operating state of the drive units driving the lamp panel to emit light; wherein in response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit.

In some embodiments, the drive units driving the lamp panel to emit light include at least two of the plurality of drive units, and the lamp panel includes a plurality of light-emitting units arranged in arrays, each of the light-emitting units including a plurality of light-emitting devices for emitting light of different colors; wherein the at least two drive units are configured to output first drive currents to a target light-emitting device during the display stage to drive the lamp panel to display a target image; and the second drive unit is configured to output, in response to detecting that the first drive unit is abnormal, a second drive current to the target light-emitting device during the display stage to drive the lamp panel to display the target image; wherein the target light-emitting device is any of the light-emitting devices on the lamp panel, and a sum of the second drive currents output by the second drive units is a sum of the first drive currents output by the at least two drive units.

In some embodiments, magnitudes of the first drive currents output to the target light-emitting device by the at least two drive units are equal or different.

In some embodiments, each of the drive units includes a plurality of drive ICs and a plurality of signal lines, wherein each of the signal lines is connected to the plurality of ICs, and the control unit is connected to the plurality of signal lines; and the control unit is configured to detect state information of signals on the connected signal lines, and determine, based on the state information, whether the drive units driving the lamp panel to emit light are abnormal.

Exemplarily, the plurality of drive ICs in each of the drive units are organized into a plurality of drive IC groups, wherein each of the drive IC groups includes a plurality of drive ICs arranged along a first direction, and the drive IC groups of the plurality of drive units are alternatively arranged in a second direction.

In some embodiments, the lamp panel includes the plurality of light-emitting units arranged in arrays, wherein each of the light-emitting units includes the plurality of light-emitting devices for emitting light of different colors; and one of the plurality of drive units is configured to drive, during a fault detection stage, a light-emitting device, corresponding to a first color, in the plurality of light-emitting units to emit light; and another one of the plurality of drive units is configured to drive, during the fault detection stage, a light-emitting device, corresponding to a second color, in the plurality of light-emitting units to emit light; wherein the first color is different from the second color.

In some embodiments, the lamp panel includes the plurality of light-emitting units arranged in arrays, wherein each of the light-emitting units includes the plurality of light-emitting devices for emitting light of different colors; wherein one of the plurality of drive units is configured to drive, during a first period of a fault detection stage, a light-emitting device, corresponding to a third color, in the plurality of light-emitting units to emit light, and stop driving, during a second period of the fault detection stage, the light-emitting device, corresponding to the third color, in the plurality of light-emitting units to emit light; and another one of the plurality of drive units is configured to drive, during the second period, a light-emitting device, corresponding to a fourth color, in the plurality of light-emitting units to emit light.

Some embodiments of the present disclosure further provide a display drive method. The display drive method includes: during a display stage, driving, by at least one of a plurality of drive units, a lamp panel to emit light, wherein the plurality of drive units are connected to the lamp panel; detecting an operating state of the drive units driving the lamp panel to emit light; and in response to the operating state of a first drive unit being abnormal, driving, by a second drive unit, the lamp panel to emit light, wherein the first drive unit is at least one of the drive units driving the lamp panel to emit light, and the second drive unit is at least one of the plurality of drive units other than the first drive unit.

In some embodiments, wherein during the display stage, driving, by the at least one of the plurality of drive units, the lamp panel to emit light includes: during the display stage, outputting, by at least two drive units in the plurality of drive units, first drive currents to a target light-emitting device to drive the lamp panel to display a target image; and wherein in response to the operating state of the first drive unit being abnormal, driving, by the second drive unit, the lamp panel to emit light includes: in response to the operating state of the first drive unit being abnormal, outputting, by the second drive unit, a second drive current to the target light-emitting device to drive the lamp panel to display the target image; wherein the target light-emitting device is any of the light-emitting devices on the lamp panel, and a sum of the second drive currents output by the second drive units is a sum of the first drive currents output by the at least two drive units.

In some embodiments, magnitudes of the first drive currents output to the target light-emitting device by the at least two drive units are equal or different.

In some embodiments, each of the drive units includes a plurality of drive ICs and a plurality of signal lines, wherein each of the signal lines is connected to the plurality of drive ICs; and detecting the operating state of the drive units driving the lamp panel to emit light includes: detecting state information of signals on the plurality of signal lines; and determining, based on the state information, the operating state of the drive units driving the lamp panel to emit light.

Exemplarily, the lamp panel includes a plurality of light-emitting units arranged in arrays, wherein each of the light-emitting units includes a plurality of light-emitting devices for emitting light of different colors.

In some embodiments, the display drive method further includes: during a fault detection stage, driving, by one of the plurality of drive units, a light-emitting device, corresponding to a first color, in the plurality of light-emitting units to emit light; and during the fault detection stage, driving, by another one of the plurality of drive units, a light-emitting device, corresponding to a second color, in the plurality of light-emitting units to emit light; wherein the first color is different from the second color.

In some embodiments, the display drive method further includes: during a first period of a fault detection stage, driving, by one of the plurality of drive units, a light-emitting device, corresponding to a third color, in the plurality of light-emitting units to emit light; and during a second period of the fault detection stage, stopping driving the light-emitting device, corresponding to the third color, in the plurality of light-emitting units to emit light, and driving, by another one of the plurality of drive units, a light-emitting device, corresponding to a fourth color, in the plurality of light-emitting units to emit light.

Some embodiments of the present disclosure further provide a display device. The display device includes a lamp panel and the display drive system as described above, wherein the display drive system is connected to the lamp panel.

Some embodiments of the present disclosure further provide a display drive device. The display device includes a memory and a processor; wherein the memory stores one or more computer programs, wherein the one or more computer programs, when loaded and run by the process, cause the processor to perform the display drive method as described above.

Some embodiments of the present disclosure further provide a non-volatile computer-readable storage medium. The non-volatile computer-readable storage medium stores one or more instructions, wherein the one or more instructions, when loaded and executed by a processor, cause the processor to perform the display drive method as described above.

Some embodiments of the present disclosure further provide a computer program product. The computer program product stores one or more instructions therein, wherein the one or more instructions, when loaded and executed by a computer, cause the computer to perform the display drive method as described above.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

The lamp panel includes a plurality of light-emitting units arranged in arrays. Each of the light-emitting units includes a plurality of sub-units for emitting light of different colors. The plurality of light-emitting units are organized into a plurality of light-emitting unit groups according to their locations, and each of the light-emitting unit groups includes a plurality of light-emitting units. The display drive system includes a plurality of drive integrated circuits (IC), and each of the drive ICs is connected to all of the light-emitting units in one of the light-emitting unit groups and is configured to drive the connected light-emitting units to emit light.

Where the drive IC in the display drive system fails or a signal line connected to the drive IC fails, at least a portion of the light-emitting units of the lamp panel fail to emit light normally, such that a display of the light-emitting device is abnormal, and thus reliability of the display drive system is low.

The present disclosure is described in further detail with reference to the accompanying drawings, to clearly present the objects, technical solutions, and advantages of the present disclosure.

For clearer understanding of the embodiments of the present disclosure, a structure of a display device is described hereinafter first.

Figure 1:
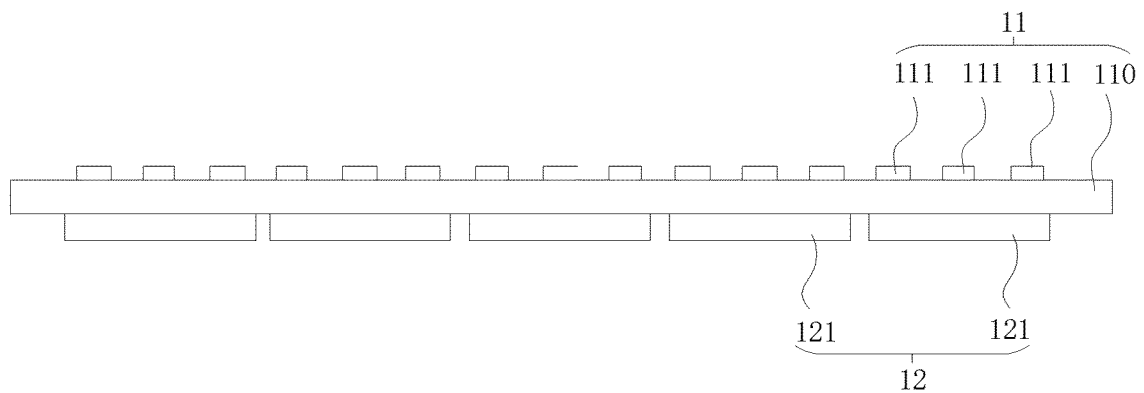
FIG. 1 is a schematic diagram of a display device in some practices.

FIG. 1 is a schematic diagram of a display device in some practices. As illustrated in FIG. 1, The display device includes a lamp panel 11 and a display drive system 12. The lamp panel 11 includes a first substrate 110 and a plurality of light-emitting units 111 disposed on a first surface of the first substrate 110.

The display drive system 12 includes a plurality of drive ICs 121. The plurality of drive ICs 121 are disposed on a second surface of the first substrate 110. The first surface and the second surface herein are two opposite surfaces of the first substrate 110. In some embodiments, the plurality of drive ICs 121 are directly connected to the second surface of the first substrate. In other embodiments, the plurality of drive ICs 121 are arranged on a second substrate (the second substrate integrated with the drive ICs is referred to as a drive board) in arrays and are connected to the lamp panel 11 by the second substrate.

Figure 2:
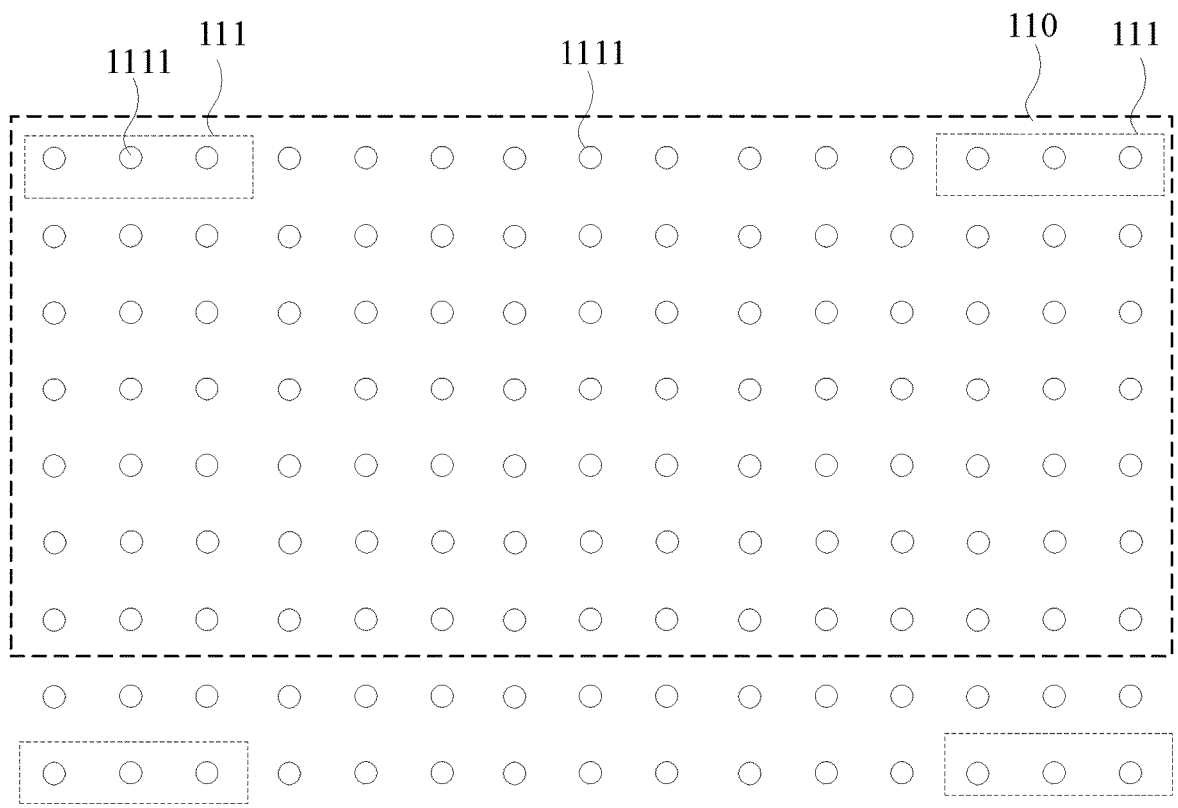
FIG. 2 is a structural top view of a partial region of the display device as illustrated in FIG. 1.

FIG. 2 is a structural top view of a partial region of the display device as illustrated in FIG. 1. As illustrated in FIG. 2, the plurality of light-emitting units 111 are arranged in arrays and form a light-emitting unit array. Each of the light-emitting units 111 includes light-emitting devices 1111 for emitting light of different colors. For example, each of the light-emitting units 111 includes a first light-emitting device, a second light-emitting device, and a third light-emitting device, wherein the first light-emitting device is configured to emit blue light, the second light-emitting device is configured to emit red light, and the third light-emitting device is configured to emit green light.

In some embodiments of the present disclosure, the light-emitting device 1111 is a current drive device. For example, the light-emitting device 1111 is a light-emitting diode (LED) chip, such as a mini LED chip or a micro LED chip. The first substrate 110 is a printed circuit board (PCB) or other types of substrate capable of routing signal lines, such as a glass substrate. The display device is an LED display device.

The light-emitting unit array is divided into a plurality of light-emitting unit sub-arrays. A dashed box in FIG. 2 is one of the light-emitting unit sub-arrays, and the light-emitting unit sub-array includes eight rows and five columns of light-emitting units 111. The light-emitting unit sub-array herein is a virtual division of the light-emitting unit array. Each of the drive ICs is connected to all of the light-emitting units in one of the light-emitting unit sub-array and is configured to drive the light-emitting units in the connected light-emitting unit sub-array to emit light.

In addition to the drive IC, the display drive system further includes a signal line connected to the drive IC. The signal line is configured to supply a corresponding signal to the drive IC to control the lamp panel to emit light.

In the case that the display drive system fails, for example, the signal line and/or the drive IC fails, at least a portion of the light-emitting units do not emit light normally, resulting in an abnormal display of the display device. Therefore, some embodiments of the present disclosure provide a display drive system. The display drive system includes a plurality of drive units. Each of the plurality of drive units is capable of independently driving the lamp panel to emit light, and at least two of the plurality of drive units are capable of jointly driving the lamp panel to emit light. In this way, during a display stage, in the case that a portion (e.g., one) of the drive units driving the lamp panel to emit light has an abnormal operating state (the drive unit with the abnormal operating state is referred to as a first drive unit), the lamp panel is driven, by at least one (a second drive unit) of the plurality of drive units other than the first drive unit, to emit light, such the reliability of the display device is improved.

In some embodiments of the present disclosure, the plurality of drive units refer to at least two drive units. For the convenience of illustration, descriptions of the embodiments of the present disclosure are given hereinafter using a scenario where the display drive system includes two drive units as an example.

Figure 3:
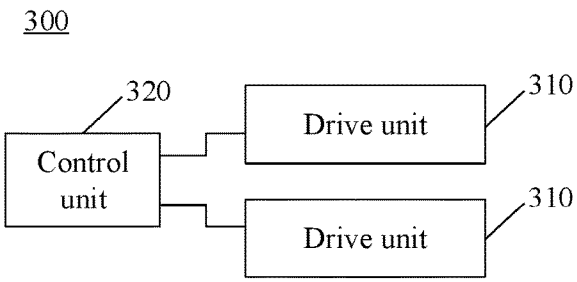
FIG. 3 is a structural schematic diagram of a display drive system according to some embodiments of the present disclosure.

The structure and functions of the display drive system are described in detail hereinafter in conjunction with the accompanying drawings. As illustrated in FIG. 3, the display drive system 300 includes two drive units 310 and a control unit 320. Both the two drive units 310 are connected to a lamp panel, and at least one of the two drive units 310 is configured to drive, during a display stage, the lamp panel to emit light. In some embodiments of the present disclosure, the two drive units 310 simultaneously drive the lamp panel to emit light, or each of the two drive units 310 independently drives the lamp panel to emit light. The control unit 320 is connected to the two drive units 310 for detecting an operating state of the drive units 310 driving the lamp panel to emit light. The control unit is further configured to drive, by a second drive unit, in response to detecting that a first drive unit is abnormal, the lamp panel to emit light. The first drive unit is one of the drive units 310 driving the lamp panel to emit light, and the second drive unit is the other of the two drive units 310 other than the first drive unit.

The display drive system according to some embodiments of the present disclosure includes two drive units that are capable of independently driving the lamp panel to emit light. Therefore, in the case that the control unit detects that one of the drive units driving the lamp panel to emit light is abnormal, the lamp panel is driven, by any other of the drive units that is normal, to emit light, such that the reliability of the display drive system is improved.

In some embodiments, the two drive units 310 are capable of simultaneously driving the lamp panel to emit light, such that the lamp panel displays a target image. In the case that the two drive units 310 simultaneously drive the lamp panel to emit light, the two drive units are configured to output first drive currents to the light-emitting devices in each of the light-emitting units corresponding to the target image to drive each of the light-emitting devices of the lamp panel to emit light.

In this case, the current required for the light-emitting device of each of the light-emitting units is allocated to the two drive units 310 according to a defined ratio, and the two drive units 310 respectively output the first drive currents to each of the light-emitting devices based on their corresponding ratio.

In some examples, the defined ratio is 1:1. That is, the two drive units 310 output the first drive currents of the same magnitude to a target light-emitting device. In this way, the first drive current output by each of the two drive units 310 to the target light-emitting device is a half of the current required for the target light-emitting device.

In other examples, the defined ratio may be any ratio other than 1:1. That is, the two drive units 310 output the first drive currents of different magnitudes to the target light-emitting device. For example, the defined ratio is 3:7 or 2:3. In the case that the defined ratio is 3:7, one of the two drive units outputs the first drive current, the magnitude of which is 30% of the current required for the target light-emitting device, to the target light-emitting device, and the other of the two drive units outputs the first drive current, the magnitude of which is 70% of the current required for the target light-emitting device, to the target light-emitting device.

The target light-emitting device herein is any of the light-emitting devices on the lamp panel.

The second drive unit is configured to output, in the case that the operating state of the first drive unit is abnormal, a second drive current to the target light-emitting device to drive the lamp panel to display the target image. For a same light-emitting device, the second drive current output by the second drive unit is equal to a sum of the first drive currents output by the two drive units.

It should be noted that in the case that the drive display system includes more than two drive units, one or more second drive units are arranged, and the second drive unit includes at least one of a drive unit that is driving the lamp panel to emit light and a drive unit that is not driving the lamp panel to emit light.

In the case that the display drive system operates normally, the lamp panel is driven, simultaneously by the two drive units, to emit light. In this way, in the case that the operating state of one of the drive units is abnormal, it is only necessary to stop the operation of the abnormal drive unit and increase the drive current output by the other drive unit with a normal operating state, such that the lamp panel still emits light according to a state when the operating state of the two drive units is normal. Because the second drive unit always drives the lamp panel to emit light during a process of switching the first drive unit to the second drive unit, the display image of the lamp panel is not interrupted, which is conducive to seamless switching of the display effect, and the display effect is further ensured.

In some examples, at least one of the two drive units 201 is further configured to fine-tune the display effect of the lamp panel by adjusting the drive current output to the target light-emitting device. For example, in the case that one of the drive units outputs the drive current of a constant magnitude to the target light-emitting device, the drive current output by one of the drive units to the target light-emitting device is increased or decreased by a defined value. In the case that a current adjustment granularity (i.e., a minimum adjustment amount employed for each adjustment, e.g., 5% of a maximum drive current corresponding to each of the drive ICs) corresponding to each of the drive ICs is constant and a maximum value of the current required for the target light-emitting device is constant, the two drive units independently output the drive currents to the target light-emitting device, such that adjustable ratings of the brightness of the target light-emitting device are more, and thus the display effect of the lamp panel is adjusted more finely.

In other embodiments, the drive unit driving the lamp panel to emit light includes only one drive unit 310. That is, at the same moment, the lamp panel is driven, by only one drive unit 310, to emit light. In this case, the drive unit 310 is configured to drive the lamp panel to display the target image by outputting the first drive current to the light-emitting device in each of the light-emitting units corresponding to the target image. The second drive unit is configured to output, in the case that the operating state of the first drive unit (i.e., the drive unit that is operating) is abnormal, the second drive current to the light-emitting device in each of the light-emitting units corresponding to the target image. The second drive current and the first drive current that are output to a same light-emitting device are equal.

In the embodiments, in the case that the first drive unit is abnormal, the lamp panel is driven by the second drive unit to emit light, such that the lamp panel is quickly restored to display images without waiting to emit light normally until the first drive unit is repaired.

The structure of the display drive system according to some embodiments of the present disclosure is described hereinafter in conjunction with FIG. 4. Each of the drive units 310 includes a plurality of drive ICs 311, and each of the drive ICs 311 is configured to drive the light-emitting units 111 in one of the light-emitting unit sub-arrays to emit light. For any of the light-emitting unit sub-arrays, a corresponding drive IC 311 exists in each of the drive units 310. That is, each of the light-emitting unit arrays is connected to two of the drive ICs 311 that respectively belong to different drive units 310.

In some embodiments of the present disclosure, each of the drive units 310 includes a plurality of drive IC groups. Each of the drive IC groups includes a plurality of drive ICs 311 arranged along a first direction x, and the drive IC groups of the two drive units are arranged alternately in a second direction y. In this way, two drive ICs 311 driving a same light-emitting unit sub-array are arranged near the corresponding light-emitting unit sub-array, which is convenient for the wiring.

Figure 4:
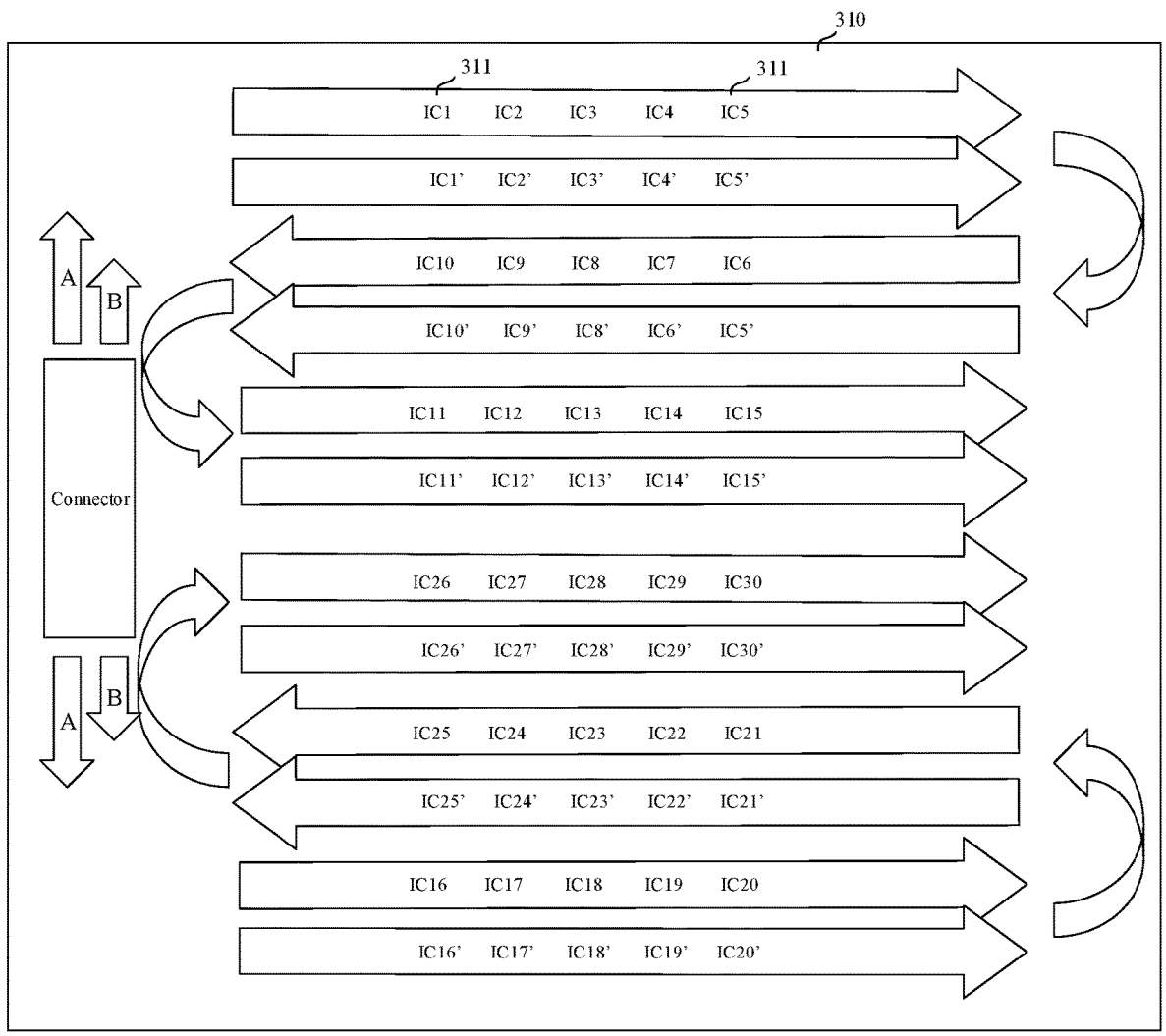
FIG. 4 is another structural schematic diagram of a display drive system according to some embodiments of the present disclosure.

For example, as illustrated in FIG. 4, one of the drive units includes drive ICs 1-30, and another one of the drive units includes drive ICs 1'-30'. Drive ICs 1-5, drive ICs 6-10, drive ICs 11-15, drive ICs 16-20, drive ICs 21-25, and drive ICs 26-30 are each organized into one of the drive IC groups. Similarly, drive ICs 1'-5 ', drive ICs 6'-10', drive ICs 11'-15', drive ICs 16'-20', drive ICs 21'-25', and drive ICs 26'-30' are each organized into one of the drive IC groups. The five drive ICs in a same drive IC group are arranged in a left-right direction, and all of the drive IC groups of the two drive units are arranged alternately in an up-down direction.

The drive unit further includes a plurality of signal lines, and each of the drive ICs is connected to at least one of the signal lines. The plurality of signal lines include at least one of: a control line, a data line, and a power supply line. The control line includes, but is not limited to, a clock (DCLK) signal line, a clock data latch (LE) signal line, and a line feed (ROW) signal line. The number of signal lines is arranged to be one or more according to actual needs, which is not limited herein.

In some examples, the second surface of the substrate is divided into at least two regions arranged along the second direction. Two groups of signal lines and the plurality of drive ICs are arranged within each of the regions, and each group of signal lines is connected to the plurality of drive ICs belonging to one of the drive units. For example, as illustrated in FIG. 4, the second surface of the substrate is divided into two regions arranged along the second direction. The drive ICs 1-15 in the drive unit A and the drive ICs 1'-15' in the drive unit B are disposed in one of the two regions; and the drive ICs 16-30 in the drive unit A and the drive ICs 16'-30' in the drive unit B are disposed in the other of the two regions. The drive ICs 1-15, the drive ICs 1'-15', the drive ICs 16-30, and the drive ICs 16'-30' are respectively connected to a group of signal lines.

With the increase of a display area of the display device, the number of drive ICs in each of the drive units increases. In the case that all of the drive ICs in one of the drive units are connected to a group of signal lines, the transmission of signals over the corresponding signal lines does not meet the performance requirements due to the limitation of a transmission distance, such that the display effect is affected. Therefore, in the embodiments of the present disclosure, lengths of the signal lines are shortened by connecting the plurality of drive ICs belonging to the same drive unit in each of the regions to a group of signal lines, such that the signals are transmitted normally over the corresponding signal lines.

Referring to FIG. 4, each group of signal lines is connected to the drive ICs in the plurality of drive IC groups, and the plurality of drive IC groups connected to each group of signal lines are spaced apart along the second direction. To facilitate the wiring of the signal lines, the signal lines are routed in a Z-shape pattern. For example, as a direction illustrated by the arrow in FIG. 4, the signal lines corresponding to the drive ICs 1-15 first extend from left to right, then extend downward for a section, then extend from right to left, then extend downward for a section, and then extend from left to right.

As described above, each of the drive ICs is connected to each of the light-emitting units in the corresponding light-emitting unit sub-array. A way in which each of the drive ICs is connected to the corresponding light-emitting unit is described hereinafter.

Figure 5:
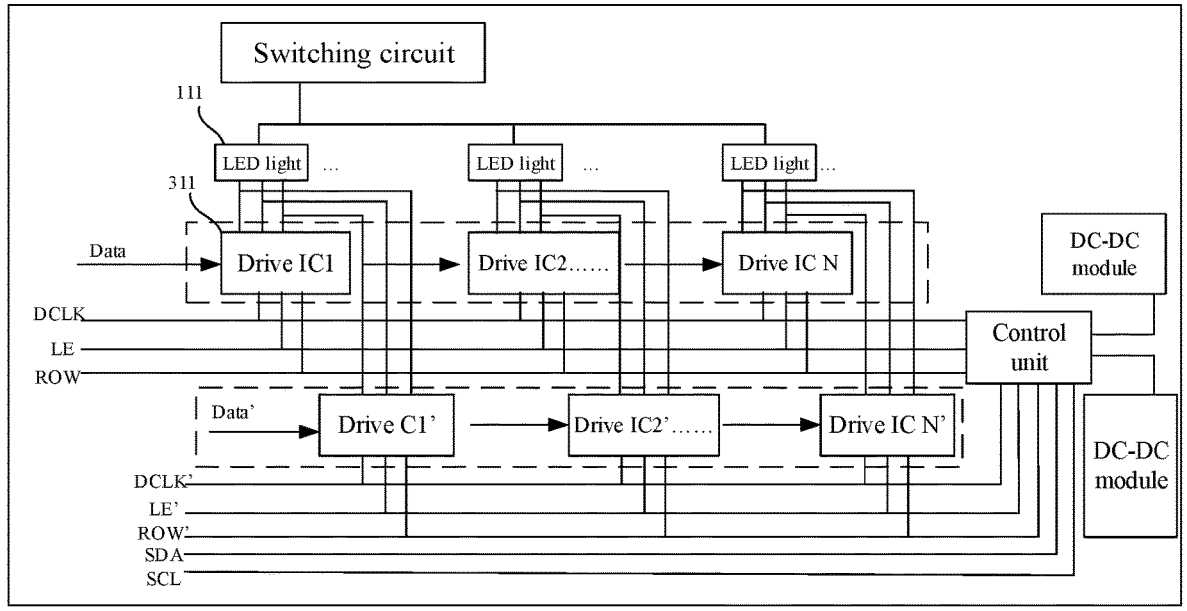
FIG. 5 is a schematic diagram of a connection of a drive IC, a signal line, and a light-emitting unit according to some embodiments of the present disclosure.

FIG. 5 is a schematic diagram of a connection of a drive IC, a signal line, and a light-emitting unit according to some embodiments of the present disclosure. An illustration is given in FIG. 5 using a scenario where the light-emitting device is an LED lamp as an example. Each of the light-emitting units includes three of the light-emitting devices, and first electrodes (e.g., anodes) of the light-emitting devices of each row of light-emitting units are connected to a switch circuit on the lamp panel. The switch circuit is configured to control the light-emitting unit array to operate according to a row-scanning mode. The switch circuit includes a plurality of switch devices, and each of the switch devices is connected to the first electrode of each of the light-emitting devices in a row of light-emitting units. In the case that the switch device is on, the row of light-emitting devices is lit. Exemplarily, the switch device is a transistor. A control electrode of the transistor is connected to a scanning signal line, a first electrode of the transistor is connected to a power supply signal line, and a second electrode of the transistor is connected to the light-emitting device in a row of light-emitting units.

As illustrated in FIG. 5, each of the drive ICs 311 includes a plurality of input pins and a plurality of output pins. Each of the input pins is correspondingly connected to one of the signal lines. Each of the drive ICs 311 is connected to the plurality of control lines, and the plurality of drive ICs are connected in series by one of the data lines. The data line is configured to transmit serial data, and the drive IC acquires corresponding image data by acquiring, based on configuration information, data of the corresponding position in the serial data.

Because each of the light-emitting units includes three of the light-emitting devices, the three output pins of the drive IC in FIG. 5 are connected to one of the light-emitting units. Each of the output pins is configured to connect to a first electrode (e.g., a cathode) of one of the light-emitting devices. The drive IC 311 is configured to output, based on a signal input from the signal line, the drive current from a target output pin to drive the light-emitting device connected to the target output pin to emit light.

Exemplarily, assuming that each of the light-emitting units includes three light-emitting devices of different colors and each of the drive ICs includes sixteen output pins, each of the drive ICs is connected to the light-emitting devices in five adjacent light-emitting units in a same row of light-emitting units (i.e., fifteen light-emitting devices), and the remaining one output pin is vacant. In the case that the display drive system drives the lamp panel to emit light employing zone scanning, assuming that each of the drive ICs corresponds to eight scans, each of the drive ICs is connected to the light-emitting devices in the corresponding five light-emitting units in each of eight rows of light-emitting units at the same time. In this way, each of the drive ICs is configured to drive a light-emitting unit sub-array of eight rows and five columns to emit light.

In some embodiments of the present disclosure, the control unit 320 is connected to at least one of the signal lines, such as being connected to all of the signal lines, and is configured to determine, based on state information of a signal on each of the signal lines, the operating state of the drive unit that is operating. Exemplarily, the state information of the signal is configured to indicate whether the signal on the signal line is abnormal. In the case that the signal on the signal line is abnormal, the operating state of the corresponding drive unit is abnormal; and in the case that the signal on the signal line is normal, the operating state of the corresponding drive unit is normal.

Exemplarily, at least one of the following implementations is employed by the control unit 320 to determine whether the signal on the signal line is abnormal.

In a first implementation, whether a duration, during which a level state of the signal is unchanged, exceeds a first defined duration is determined. In the case that the duration exceeds the first defined duration, the signal is abnormal; and in the case that the duration does not exceed the first defined duration, the signal is normal.

In a second implementation, whether a duration, during which a level signal is not transmitted over the signal line, exceeds a second defined duration is determined. In the case that the duration exceeds the second defined duration, the signal is abnormal; and in the case that the duration does not exceed the second defined duration, the signal is normal.

In a third implementation, whether a jump amplitude of the signal transmitted over the signal line exceeds a jump amplitude threshold is determined. In the case that the jump amplitude of the signal exceeds the jump amplitude threshold, the signal is abnormal; and in the case that the jump amplitude of the signal does not exceed the jump amplitude threshold, the signal is normal.

In a fourth implementation, whether an amplitude of the signal transmitted over the signal line exceeds an amplitude threshold is determined. In the case that the amplitude of the signal exceeds the amplitude threshold, the signal is abnormal; and in the case that the amplitude of the signal does not exceed the amplitude threshold, the signal is normal.

The first defined duration and the second defined duration are defined according to actual needs, which are not limited herein.

In some embodiments of the present disclosure, the drive unit 310, the control unit 320, and the signal line 330 are disposed on a same substrate. Exemplarily, the control unit 320 is implemented by employing a microcontroller unit (MCU), a complex programmable logic device (CPLD), or a field programmable gate array (FPGA), which is not limited herein.

Figure 6:
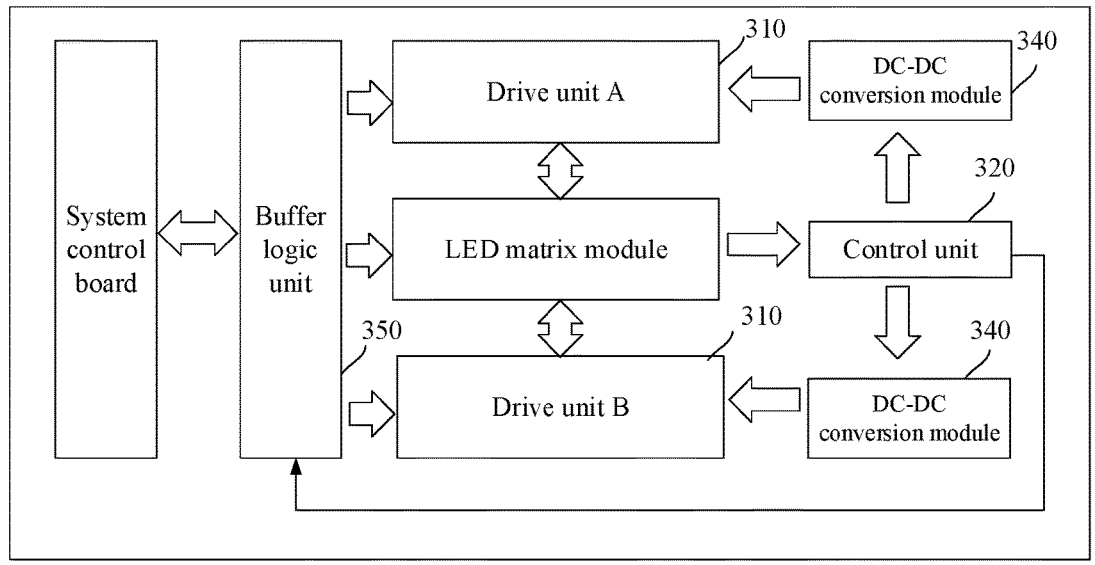
FIG. 6 is still another structural schematic diagram of a display drive system according to some embodiments of the present disclosure.

FIG. 6 is still another structural schematic diagram of a display drive system according to some embodiments of the present disclosure. As illustrated in FIG. 6, the display drive system further includes two direct current-direct current (DC-DC) conversion modules 340, and each of the two DC-DC conversion modules 340 is configured to supply power to each of the corresponding drive units 310. A control terminal (an enable terminal) of the DC-DC conversion module 340 is connected to the control unit 320. During the display stage, the control unit 320 controls the two DC-DC conversion modules to operate, such that the two drive units 310 drive the lamp panel to emit light. In the case that the control unit 320 detects that the operating state of the first drive unit is abnormal, the control unit 320 controls the DC-DC conversion module 340 corresponding to the first drive unit to stop operating, such that the first drive unit stops operating, and meanwhile, the control unit 320 maintains another DC-DC conversion module 340 to supply power to the second drive unit. Moreover, the control unit 320 feeds fault information back to a system control device (e.g., a system control board), such that the system control device adjusts a data signal transmitted to the second drive unit, and thus the drive IC in the second drive unit increases the drive current output to the target light-emitting device. In this way, the switching from two drive units to jointly drive the lamp panel to emit light to the second drive unit to drive the lamp panel to emit light is implemented.

The fault information includes, but is not limited to, a fault time, a fault content, and a fault location. The fault time is configured to indicate a time when the fault is detected, the fault content is configured to indicate a type of abnormality of the signal on the signal line (e.g., the duration during which the level state of the signal is unchanged exceeds the first defined duration, the duration during which the level signal is not transmitted over the signal line exceeds the second defined duration, and the like), and the fault location is configured to indicate the faulted drive unit.

In some examples, the display drive system further includes a buffer logic unit 350. The buffer logic unit 350, the drive unit 310, and the control unit 320 are disposed on the same substrate. The buffer logic unit 350 is connected to the system control device and is connected to the control unit 320 and the drive unit 310 by the signal line 330. In this way, the buffer logic unit 350 is capable of acting as the signal level conversion and/or data buffering between the system control device and the control unit 310 and the drive unit 320.

In some embodiments of the present disclosure, the display drive system is further configured to drive the lamp panel to display images during a fault detection stage, such that the fault is located in the case that the fault is present in the display drive system.

In some embodiments, one of the two drive units is configured to drive, during the fault detection stage, a light-emitting device, corresponding to a first color, in the plurality of light-emitting units to emit light; and the other of the two drive units is configured to drive, during the fault detection stage, a light-emitting device, corresponding to a second color, in the plurality of light-emitting units to emit light. The first color is different from the second color.

In each of the light-emitting units, one light-emitting device corresponding to the first color is arranged, and one light-emitting device corresponding to the second color is arranged. For example, the first color is red and the second color is blue; or, the first color is blue and the second color is green.

During the fault detection stage, the two drive units respectively drive the light-emitting devices corresponding to different colors in each of the light-emitting units of the lamp panel to emit light, such that each of the light-emitting units emits the light mixed with the light of the first color and light of the second color. Based on the color emitted by each of the light-emitting units on the lamp panel, whether the fault is present in the display drive system and the fault information in the event of the fault are determined. The fault information is configured to indicate the fault location, wherein the fault location includes, but is not limited to, the faulted drive unit and the faulted drive IC.

For example, in the case that each of the light-emitting units emits the light mixed with the light of the first color and the light of the second color, the display drive system is fault-free. For example, in the case that a portion of the light-emitting units only emit the light of the first color, the drive ICs for driving the light-emitting units to emit the light of the second color corresponding to the portion of the light-emitting units are faulted. Further, for example, in the case that a portion of the light-emitting units only emits the light of the second color, the drive ICs for driving the light-emitting units to emit the light of the first color corresponding to the portion of the light-emitting units are faulted.

The fault detection is more efficient by employing the two drive units to simultaneously drive, during the fault detection stage, the lamp panel to emit light.

In other embodiments, one of the plurality of drive units is configured to drive, during a first period of the fault detection stage, a light-emitting device, corresponding to a third color, in the plurality of light-emitting units to emit light, and stop driving, during a second period of the fault detection stage, the light-emitting device, corresponding to the third color, in the plurality of light-emitting units to emit light; and another one of the plurality of drive units is configured to drive, during the second period, a light-emitting device, corresponding to a fourth color, in the plurality of light-emitting units to emit light. The second period is a period following the first period.

Optionally, the third color and the fourth color are the same or different. In some examples, the third color is the same as a color of light emitted by a single light-emitting device, such as red, blue, or green; in other examples, the third color is the same as a color of mixed light emitted by the plurality of light-emitting devices in a same light-emitting unit, for example, the third color is purple, which is acquired by mixing light emitted by a light-emitting device emitting red light and light emitted by a light-emitting device emitting blue light.

The system control board is connected to the control unit 320 by an I2C bus (e.g., the SCL line and the SDA line in FIG. 5) and transmits a fault detection instruction to the control unit 320 by the I2C bus. The fault detection instruction is configured to instruct the control unit 320 to enter the fault detection stage. Upon receiving the fault detection instruction, the control unit 320 enters the fault detection stage. During the fault detection stage, the system control board transmits voltage data, corresponding to a color to be displayed, to each of the drive ICs in the drive unit by a transmitter and a receiver, and the drive IC controls, based on the voltage data, the corresponding light-emitting device to emit light.

It should be noted that the system control board is connected to the control unit by other means, such as a serial peripheral interface (SPI) or an RS232.

It should be noted that for the case where the display drive system includes more than two drive units, reference is made to the case where the display drive system includes two drive units, which is not repeated herein.

Some embodiments of the present disclosure further provide a display device. The display device includes a lamp panel and a display drive system. The display drive system is configured to drive the lamp panel to emit light. For the detailed description of the display drive system, reference is made to the above embodiments, which is not repeated herein.

Exemplarily, the display device includes, but is not limited to, a display, a smartphone, a tablet computer, a laptop computer, and any other terminal device with a display function.

The display is a large outdoor display, such as a ground screen, a façade display screen, or various types of shaped creative screens. The display is especially suitable for scenes where the display cannot be interrupted, such as a large performance event.

Figure 7:
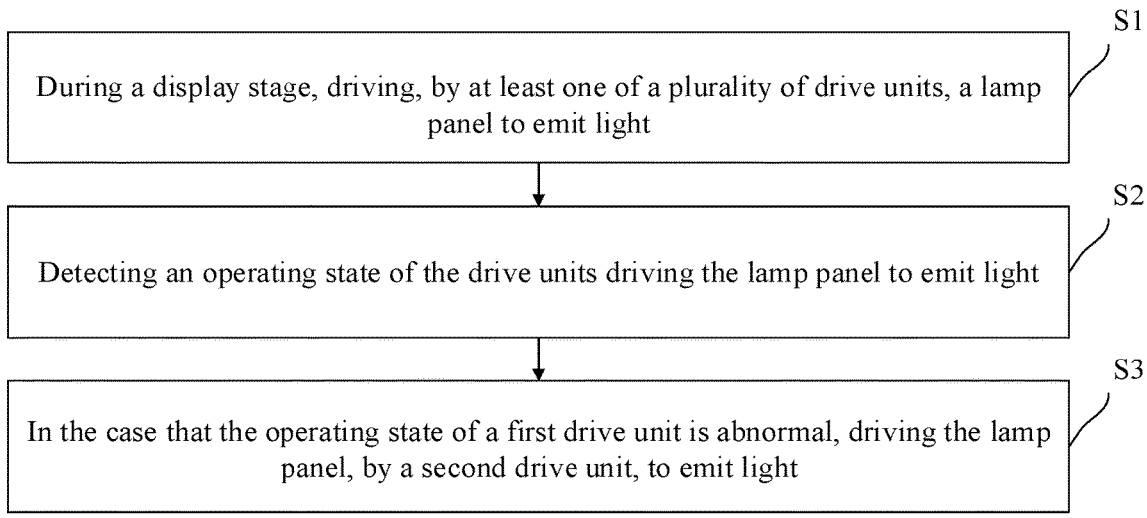
FIG. 7 is a flowchart of a display drive method according to some embodiments of the present disclosure.

Some embodiments of the present disclosure further provide a display drive method. The display drive method is performed by the control unit described above. As illustrated in FIG. 7, the display drive method includes the following steps.

In S1, during a display stage, a lamp panel is driven, by at least one of a plurality of drive units, to emit light, wherein the plurality of drive units are connected to the lamp panel In S2, an operating state of the drive units driving the lamp panel to emit light are detected.

In the embodiments of the present disclosure, the operating state includes a normal state and an abnormal state. The normal state indicates that the drive unit is capable of normally driving the lamp panel to emit light. The abnormal state indicates that the drive unit is not capable of normally driving the lamp panel to emit light, which leads to an abnormal display of the lamp panel.

In S3, in the case that the operating state of a first drive unit is abnormal, the lamp panel is driven, by a second drive unit, to emit light.

The first drive unit is at least one of the drive units driving the lamp panel to emit light, and the second drive unit is at least one of the drive units included in the drive display system other than the first drive unit.

In some embodiments, S1 includes: during the display stage, outputting first drive currents to a target light-emitting device by at least two of the drive units to drive the lamp panel to display a target image; accordingly, S3 includes: in response to the operating state of the first drive unit being abnormal, outputting a second drive current, by the second drive unit, to the target light-emitting device to drive the lamp panel to display the target image; wherein the target light-emitting device is any light-emitting device on the lamp panel, and a sum of the second drive currents output by the second drive currents is equal to a sum of the first drive currents output by the at least two of the drive units.

Optionally, magnitudes of the first drive currents output by the at least two of the drive units to the target light-emitting device are the same or different.

In other embodiments, S1 includes: during the display stage, outputting the first drive current to the target light-emitting device by one of the drive units to drive the lamp panel to display the target image; and S3 includes: in response to the operating state of the first drive unit being abnormal, outputting the second drive current, by the second drive unit, to the target light-emitting device to drive the lamp panel to display the target image; wherein the target light-emitting device is any light-emitting device on the lamp panel, and the second drive current is equal to the sum of the first drive currents.

Exemplarily, each of the drive units includes a plurality of drive ICs and a plurality of signal lines, wherein each of the signal lines is connected to the plurality of drive ICs; and wherein the operating state of the drive units driving the lamp panel to emit light being detected includes: detecting state information of signals on the plurality of signal lines; and determining, based on the state information of the signal, the operating state of the drive units driving the lamp panel to emit light.

In some embodiments, the display drive method further includes: during a fault detection stage, driving, by one of the plurality of drive units, a light-emitting device, corresponding to a first color, in the plurality of light-emitting units to emit light; and during the fault detection stage, driving, by another one of the plurality of drive units, a light-emitting device, corresponding to a second color, in the plurality of light-emitting units to emit light; wherein the first color is different from the second color.

In other embodiments, the display drive method further includes: during a first period of the fault detection stage, driving, by one of the plurality of drive units, a light-emitting device, corresponding to a third color, in the plurality of light-emitting units to emit light; and during a second period of the fault detection stage, stopping driving the light-emitting device, corresponding to the third color, in the plurality of light-emitting units to emit light, and driving, by another one of the plurality of drive units, a light-emitting device, corresponding to a fourth color, in the plurality of light-emitting units to emit light.

Figure 8:
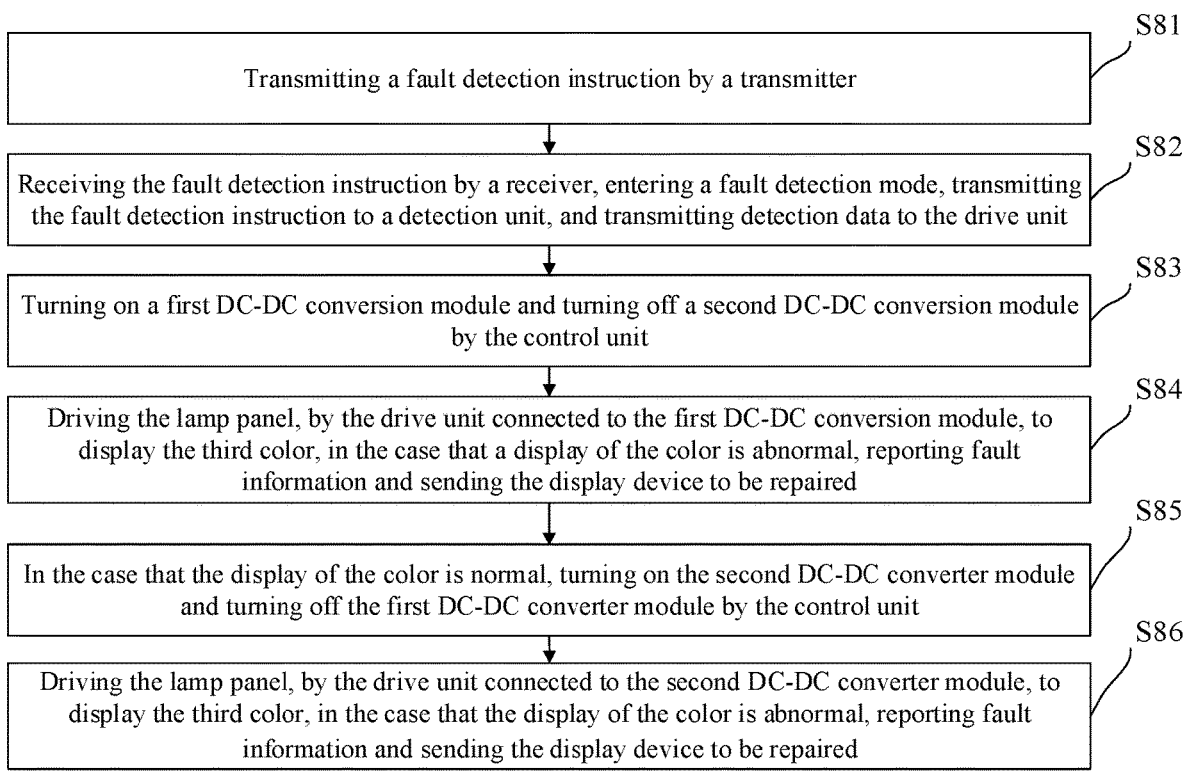
FIG. 8 is a process schematic diagram of a fault detection process according to some embodiments of the present disclosure.

FIG. 8 illustrates a fault detection process. As illustrated in FIG. 8, the fault detection process includes the following steps. In S81, a fault detection instruction is transmitted by a transmitter. In S82, the fault detection instruction is received by a receiver, a fault detection mode is entered, the fault detection instruction is transmitted to a detection unit, and detection data is transmitted to the drive unit, wherein the detection data corresponds to the color to be displayed. In S83, a first DC-DC conversion module is turned on and a second DC-DC conversion module is turned off by the control unit, wherein the first DC-DC conversion module and the second DC-DC conversion module are the two DC-DC conversion modules as described above. In S84, the lamp panel is driven by the drive unit connected to the first DC-DC conversion module to display the third color. In the case that a display of the color is abnormal, fault information is reported and the display device is sent to be repaired; and in the case that the display of the color is normal, S85 is performed. In S85, the second DC-DC converter module is turned on and the first DC-DC converter module is turned off by the control unit. In S86, the lamp panel is driven, by the drive unit connected to the second DC-DC converter module, to display the third color. In the case that the display of the color is abnormal, fault information is reported and the display device is sent to be repaired; and in the case that the display of the color is normal, the display device is fault-free, and the fault detection process is exited.

It should be noted that the display drive method is based on the same concept as the display drive system described above. For the relevant contents, reference is made to the display drive system as described above, which is not repeated herein.

Figure 9:
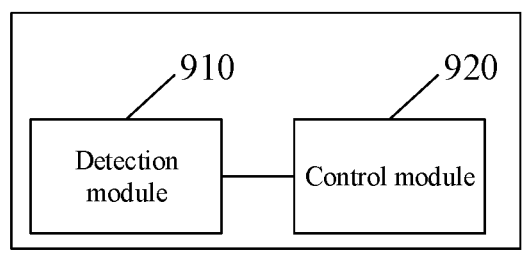
FIG. 9 is a structural schematic diagram of a display drive device according to some embodiments of the present disclosure.

Some embodiments of the present disclosure further provide a display drive device. As illustrated in FIG. 9, the display drive device includes a detection module 910 and a control module 920. The control module 920 is configured to drive, during a display stage by at least one of a plurality of drive units, a lamp panel to emit light, wherein the plurality of drive units are connected to the lamp panel. The detection module 910 is configured to detect an operating state of the drive units driving the lamp panel to emit light. The control module 920 is further configured to drive, in the case that the detection module 910 detects that the operating state of a first drive unit is abnormal, by a second drive unit, the lamp panel to emit light. The first drive unit is at least one of the drive units driving the lamp panel to emit light, and the second drive unit is at least one of the plurality of drive units other than the first drive unit.

In some embodiments, the control unit 920 is further configured to, during the display stage by at least two of the plurality of drive units, output first drive currents to a target light-emitting device to drive the lamp panel to display a target image. In the case that the operating state of the first drive unit is abnormal, to output, by the second drive unit, a second drive current to the target light-emitting device to drive the lamp panel to display the target image. The target light-emitting device is any light-emitting device on the lamp panel, and a sum of the second drive currents output by the second drive currents is equal to a sum of the first drive currents output by the at least two of the drive units.

Optionally, the detection module 910 is further configured to detect state information of signals on a plurality of signal lines; and determine, based on the state information, the operating state of the drive units driving the lamp panel to emit light.

Optionally, the control module 920 is further configured to drive, during a fault detection stage by one of the plurality of drive units, a light-emitting device, corresponding to a first color, in the plurality of light-emitting units to emit light; and drive, during the fault detection stage by another one of the plurality of drive units, a light-emitting device, corresponding to a second color, in the plurality of light-emitting units to emit light, wherein the first color is different from the second color.

Optionally, the control module 920 is further configured to drive, during a first period of the fault detection stage by one of the plurality of drive units, a light-emitting device, corresponding to a third color, in the plurality of light-emitting units to emit light; and stop driving, during a second period of the fault detection stage, the light-emitting device, corresponding to the third color, in the plurality of light-emitting units to emit light, and drive, by another one of the plurality of light-emitting unit, a light-emitting device, corresponding to a fourth color, in the plurality of light-emitting units to emit light.

It should be noted that: when the display drive device according to the above embodiments performs the display drive, a description is only given to the above division of the functional modules. The above functions of the apparatus may be distributed to different functional modules according to actual needs. That is, an internal structure of the apparatus is divided into different functional modules to implement a part or all of the functions as described above. In addition, the display drive device according to the above embodiments is based on the same concept as the display drive method embodiments as described above, and the specific implementation process of the display drive device is detailed in the method embodiments, which is not repeated herein.

Figure 10:
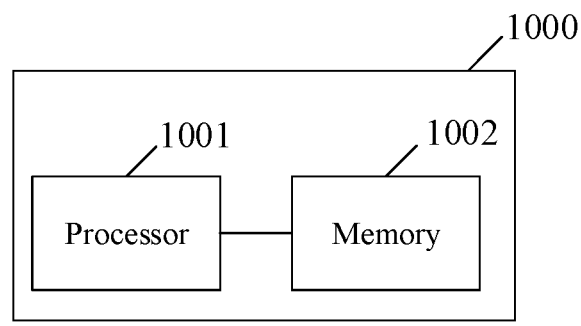
FIG. 10 is a structural schematic diagram of another display drive device according to some embodiments of the present disclosure.

FIG. 10 is a structural block diagram of another display drive device according to some embodiments of the present disclosure. The display drive device is a computer device. The display drive device 1000 includes a processor 1001 and a memory 1002.

The processor 1001 includes one or more processing cores, such as a five-core processor, an eight-core processor, and the like. The processor 1001 is implemented using at least one hardware form of a digital signal processor (DSP), a field-programmable gate array (FPGA), or a programmable logic array (PLA). The processor 1001 further includes a main processor and a co-processor. The main processor is a processor employed to process data in an awakening state, also referred to as a central processing unit (CPU); and the co-processor is a low-power processor employed to process data in a standby state.

The memory 1002 includes one or more computer-readable storage media. The one or more computer-readable storage media are non-volatile. The memory 1002 further includes a high-speed random access memory and a non-volatile memory, such as one or more disk storage devices and a flash memory storage device. In some embodiments, the non-volatile computer-readable storage medium in the memory 1002 is employed to store one or more instructions, wherein the one or more instructions, when loaded and executed by processor 1001, causes the processor 101 to perform the display drive method according to some embodiments of the present disclosure.

It should be understood by those skilled in the art that the structure illustrated in FIG. 10 does not constitute a limitation to the computer device 1000. The computer device 1000 includes more or fewer components than illustrated in FIG. 10, or a combination of certain components, or are arranged with different components.

Some embodiments of the present disclosure further provide a non-volatile computer-readable storage medium storing one or more instructions therein. The one or more instructions stored in the non-volatile computer-readable storage medium, when loaded and executed by a processor of a computer device, cause the computer device to perform the display drive method according to some embodiments of the present disclosure.

Some embodiments of the present disclosure further provide a computer program product storing one or more programs/instructions therein, wherein the one or more programs/instructions, when loaded and executed by a processor, cause the processor to perform the display drive method according to some embodiments of the present disclosure.

It should be noted that unless otherwise defined, technical or scientific terms used in the embodiments of the present disclosure shall have ordinary meanings understandable by persons of ordinary skill in the art to which the disclosure belongs. The terms "first," "second," and the like used in the embodiments of the present disclosure are not intended to indicate any order, quantity, or importance, but are merely used to distinguish the different components. The terms "comprise," "include," and derivatives or variations thereof are used to indicate that the element or object preceding the terms covers the element or object following the terms and its equivalents, and shall not be understood as excluding other elements or objects. The terms "connect," "contact," and the like are not intended to be limited to physical or mechanical connections, but may include electrical connections, either direct or indirect connection. The terms "on," "under," "left," "right" "top," and "bottom" are only used to indicate the relative positional relationship. When the absolute position of the described object changes, the relative positional relationship may change accordingly.

Described above are not intended to construe any limitation to the present disclosure in any form. Although the present disclosure has been disclosed with reference to the embodiments, described above are not intended to limit the present disclosure. Changes or modifications may be made, within the scope of the technical solutions of the present disclosure, by those skilled in the art to be the equivalent embodiments of equivalent changes by using the technical content disclosed above. However, any simple modifications and equivalent changes and modifications made based on the technical substance of the present disclosure shall be included in the scope of the technical solutions of the present disclosure.

What is claimed is:

1. A display drive system, comprising: a plurality of drive units and a control unit; wherein the plurality of drive units are connected to a lamp panel, and at least one of the plurality of drive units is configured to drive, during a display stage, the lamp panel to emit light; and the control unit is connected to the plurality of drive units, and is configured to detect an operating state of the drive units driving the lamp panel to emit light;

wherein in response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit; and the lamp panel comprises a light-emitting unit array formed by a plurality of light-emitting units arranged in arrays, the light-emitting unit array comprising a plurality of light-emitting unit sub-arrays; and a plurality of drive integrated circuits (IC) comprised in each of the drive units are organized into a plurality of drive IC groups, each of the drive IC groups comprising a plurality of drive ICs connected in series and arranged along a first direction, and the drive IC groups of the plurality of drive units being alternatingly arranged in a second direction;

wherein each of the light-emitting unit sub-arrays is connected to two of the drive ICs that respectively belong to different drive units, and the two of the drive ICs are arranged adjacently and alternatingly arranged in the second direction.

2. The display drive system according to claim 1, wherein the drive units driving the lamp panel to emit light comprise at least two of the plurality of drive units, and each of the light-emitting units comprises a plurality of light-emitting devices for emitting light of different colors; wherein the at least two drive units are configured to output first drive currents to a target light-emitting device during the display stage to drive the lamp panel to display a target image; and the second drive unit is configured to output, in response to detecting that the first drive unit is abnormal, a second drive current to the target light-emitting device during the display stage to drive the lamp panel to display the target image;

wherein the target light-emitting device is any of the light-emitting devices on the lamp panel, in a case that the number of second drive units is one, the second drive current is equal to a sum of the first drive currents output by the at least two drive units, and in a case that the number of second drive units is multiple, a sum of the second drive currents output by the second drive units is the sum of the first drive currents output by the at least two drive units.

3. The display drive system according to claim 2, wherein the at least two drive units output the first drive currents to the target light-emitting device in respective corresponding proportions.

4. The display drive system according to claim 2, wherein one of the plurality of drive units is configured to drive, during a fault detection stage, a light-emitting device, corresponding to a first color, in the plurality of light-emitting units to emit light; and another one of the plurality of drive units is configured to drive, during the fault detection stage, a light-emitting device, corresponding to a second color, in the plurality of light-emitting units to emit light;

wherein the first color is different from the second color.

5. The display drive system according to claim 2, wherein one of the plurality of drive units is configured to drive, during a first period of a fault detection stage, a light-emitting device, corresponding to a third color, in the plurality of light-emitting units to emit light, and stop driving, during a second period of the fault detection stage, the light-emitting device, corresponding to the third color, in the plurality of light-emitting units to emit light; and another one of the plurality of drive units is configured to drive, during the second period, a light-emitting device, corresponding to a fourth color, in the plurality of light-emitting units to emit light.

6. The display drive system according to claim 1, wherein each of the drive units comprises a plurality of signal lines, each of the signal lines being connected to the plurality of drive ICs, and the control unit being connected to the plurality of signal lines;

wherein the control unit is configured to detect state information of signals on the connected signal lines, and determine, based on the state information, whether the drive units driving the lamp panel to emit light are abnormal.

7. A display drive method, comprising:

during a display stage, driving, by at least one of a plurality of drive units, a lamp panel to emit light, wherein the plurality of drive units are connected to the lamp panel;

detecting an operating state of the drive units driving the lamp panel to emit light; and in response to the operating state of a first drive unit being abnormal, driving, by a second drive unit, the lamp panel to emit light, wherein the first drive unit is at least one of the drive units driving the lamp panel to emit light, and the second drive unit is at least one of the plurality of drive units other than the first drive unit;

wherein the lamp panel comprises a light-emitting unit array formed by a plurality of light-emitting units arranged in arrays, the light-emitting unit array comprising a plurality of light-emitting unit sub-arrays; and a plurality of drive integrated circuits (IC) comprised in each of the drive units are organized into a plurality of drive IC groups, each of the drive IC groups comprising a plurality of drive ICs connected in series and arranged along a first direction, and the drive IC groups of the plurality of drive units being alternatingly arranged in a second direction;

wherein each of the light-emitting unit sub-arrays is connected to two of the drive ICs that respectively belong to different drive units, and the two of the drive ICs are arranged adjacently and alternatingly in the second direction.

8. The method according to claim 7, wherein during the display stage, driving, by the at least one of the plurality of drive units, the lamp panel to emit light comprises:

during the display stage, outputting, by at least two of the plurality of drive units, first drive currents to a target light-emitting device to drive the lamp panel to display a target image;

in response to the operating state of the first drive unit being abnormal, driving, by the second drive unit, the lamp panel to emit light comprises:

in response to the operating state of the first drive unit being abnormal, outputting, by the second drive unit, a second drive current to the target light-emitting device to drive the lamp panel to display the target image;
wherein the target light-emitting device is any of the light-emitting devices on the lamp panel, in a case that the number of second drive units is one, the second drive current is equal to a sum of the first drive currents output by the at least two drive units, and in a case that the number of the second drive units is multiple, a sum of the second drive currents output by the second drive units is the sum of the first drive currents output by the at least two drive units.

9. The method according to claim 8, wherein the at least two drive units output the first drive currents to the target light-emitting device in respective corresponding proportions.

10. The method according to claim 7, wherein
each of the drive units comprises a plurality of signal lines, each of the signal lines being connected to the plurality of drive ICs; and
detecting the operating state of the drive units driving the lamp panel to emit light comprises:
detecting state information of signals on the plurality of signal lines; and
determining, based on the state information, the operating state of the drive units driving the lamp panel to emit light.

11. The method according to claim 7, wherein each of the light-emitting units comprises a plurality of light-emitting devices for emitting light of different colors; and
the display drive method further comprises:
during a fault detection stage, driving, by one of the plurality of drive units, a light-emitting device, corresponding to a first color, in the plurality of light-emitting units to emit light; and
during the fault detection stage, driving, by another one of the plurality of drive units, a light-emitting device, corresponding to a second color, in the plurality of light-emitting units to emit light;
wherein the first color is different from the second color.

12. The method according to claim 7, wherein
each of the light-emitting units comprises a plurality of light-emitting devices for emitting light of different colors; and
the display drive method further comprises:
during a first period of a fault detection stage, driving, by one of the plurality of drive units, a light-emitting device, corresponding to a third color, in the plurality of light-emitting units to emit light; and
during a second period of the fault detection stage, stopping driving the light-emitting device, corresponding to the third color, in the plurality of light-emitting units to emit light, and driving, by another one of the plurality of drive units, a light-emitting device, corresponding to a fourth color, in the plurality of light-emitting units to emit light.

13. A display drive device, comprising: a memory and a processor;
wherein the memory stores one or more computer programs, wherein the one or more computer programs, when loaded and run by the processor, cause the processor to perform the display drive method as defined in claim 7.

14. A non-volatile computer-readable storage medium, storing one or more instructions therein, wherein the one or more instructions, when loaded and executed by a processor, cause the processor to perform the display drive method as defined in claim 7.

15. A display device, comprising: a lamp panel and a display drive system;
wherein the display drive system comprises: a plurality of drive units and a control unit; wherein
the plurality of drive units are connected to a lamp panel, and at least one of the plurality of drive units is configured to drive, during a display stage, the lamp panel to emit light; and
the control unit is connected to the plurality of drive units, and is configured to detect an operating state of the drive units driving the lamp panel to emit light;
wherein in response to detecting that a first drive unit is abnormal, the lamp panel is driven, by a second drive unit, to emit light, wherein the first drive unit is at least one of the drive units driving the lamp panel to emit light, and the second drive unit is at least one of the plurality of drive units other than the first drive unit; and
the lamp panel comprises a light-emitting unit array formed by a plurality of light-emitting units arranged in arrays, the light-emitting unit array comprising a plurality of light-emitting unit sub-arrays; and a plurality of drive integrated circuits (IC) comprised in each of the drive units are organized into a plurality of drive IC groups, each of the drive IC groups comprising a plurality of drive ICs connected in series and arranged along a first direction, and the drive IC groups of the plurality of drive units being alternatingly arranged in a second direction; wherein each of the light-emitting unit sub-arrays is connected to two of the drive ICs that respectively belong to different drive units, and the two of the drive ICs are arranged adjacently and alternatively alternatingly in the second direction;
wherein the display drive system is connected to the lamp panel.

16. The display device according to claim 15, wherein the drive units driving the lamp panel to emit light comprise at least two of the plurality of drive units, and each of the light-emitting units comprises a plurality of light-emitting devices for emitting light of different colors; wherein
the at least two drive units are configured to output first drive currents to a target light-emitting device during the display stage to drive the lamp panel to display a target image; and
the second drive unit is configured to output, in response to detecting that the first drive unit is abnormal, a second drive current to the target light-emitting device during the display stage to drive the lamp panel to display the target image;
wherein the target light-emitting device is any of the light-emitting devices on the lamp panel, in a case that the number of second drive units is one, the second drive current is equal to a sum of the first drive currents output by the at least two drive units, and in a case that the number of the second drive units is multiple, a sum of the second drive currents output by the second drive units is the sum of the first drive currents output by the at least two drive units.

17. The display device according to claim 16, wherein the at least two drive units output the first drive currents to the target light-emitting device in respective corresponding proportions.

18. The display device according to claim 15, wherein each of the drive units comprises a plurality of signal lines, each of the signal lines being connected to the plurality of drive ICs, and the control unit being connected to the plurality of signal lines;

wherein the control unit is configured to detect state information of signals on the connected signal lines, and determine, based on the state information, whether the drive units driving the lamp panel to emit light are abnormal.

* * * * *